United States Patent [19]

Lee

[11] 4,046,474

[45] Sept. 6, 1977

[54] BLACK-BODY WAFER SUPPORT FIXTURE FOR EXPOSURE OF PHOTORESIST

[75] Inventor: Soo N. Lee, Irvine, Calif.

[73] Assignee: Rockwell International Corporation, El Segundo, Calif.

[21] Appl. No.: 632,736

[22] Filed: Nov. 17, 1975

[51] Int. Cl.² ............ G03B 27/52; G03B 27/32; G03B 27/04

[52] U.S. Cl. .................... 355/43; 355/77; 355/113; 427/43

[58] Field of Search ............ 355/43, 72, 113, 86, 355/75, 77; 427/43; 354/1, 288

[56] References Cited

U.S. PATENT DOCUMENTS

| | | | |
|---|---|---|---|
| 1,564,821 | 12/1925 | Bornmann | 354/288 |
| 2,155,149 | 4/1939 | Rutherford | 355/113 |
| 2,866,704 | 12/1958 | Korkosz et al. | 355/77 X |
| 3,476,476 | 11/1969 | Chitayat | 355/86 UX |
| 3,620,833 | 11/1971 | Gleim et al. | 427/43 |
| 3,802,102 | 4/1974 | Licciardi | 355/113 X |
| 3,844,655 | 10/1974 | Johannsmeier | 355/43 |
| 3,888,673 | 6/1975 | Suzuki et al. | 354/1 X |

Primary Examiner—Donald A. Griffin
Attorney, Agent, or Firm—H. Fredrick Hamann; G. Donald Weber, Jr.; Robert Ochis

[57] ABSTRACT

Photoresist coated transparent structures are supported in a black body (reflectionless) holder during activating exposure of the photoresist. When the photoresist coated structure is positioned in the holder, there is no reflecting surface close enough to the photoresist coated structure for photoresist-activating radiation which has once passed through the structure to be reflected back into the photoresist with sufficient intensity to expose the photoresist.

13 Claims, 6 Drawing Figures

BLACK-BODY WAFER SUPPORT FIXTURE FOR EXPOSURE OF PHOTORESIST

The invention herein described was made in the course of or under a contract or subcontract thereunder with the United States Air Force.

BACKGROUND OF THE INVENTION

1. Field of the Invention

The invention relates to the field of structures and method for supporting photoresist covered transparent substrates during exposure of the photoresist to photoresist-activating radiation.

2. Prior Art

In order to obtain high yields of high quality operative CMOS/SOS devices, it has been found necessary to protect the edges of silicon islands on a sapphire substrate and the portions of the substrate which are not covered by the silicon from interacting with chemicals and ambients utilized during the fabrication of active devices in the silicon. Such protection can be provided by a layer of silicon oxide overlying the edges of the silicon islands and the sapphire between the islands.

One prior art technique for coating a silicon island with silicon oxide is to thermally grow oxide in an oxidizing ambient atmosphere, thereby consuming silicon of the island to form the silicon oxide. Unfortunately, oxide grown by this technique is undercut at the interface between the sapphire substrate and the silicon oxide. This results in overcoatings of other materials being discontinuous and/or having voids within the undercuts. Where the overcoating material is intended to form circuits by electrically interconnecting spaced-apart portions of the structure, electrical opens which result from the discontinuous character of the overcoating render the circuits inoperative. Where voids occur within the undercuts, subsequent processing solutions and atmospheres can enter the voids. Trapping of processing solutions in the voids adversely effects the useful life of the circuits.

Another prior art technique for coating the edges of the silicon islands with protective silicon oxide is to deposit a layer of silox over the tops and edges of the islands and on the portion of the sapphire substrate which is exposed between the islands. Silox is formed by the interaction of silane ($SiH_4$) and oxygen ($O_2$) in the vicinity of the silicon-on-sapphire wafer. The silicon of the islands is not intentionally consumed to produce the deposited silox. Subsequently, the silox is coated with a layer of negative photoresist. After the photoresist is prebaked the wafer is placed photoresist coating down on top of a wafer chuck in preparation for activation of the photoresist. The photoresist is activated by exposure to photoresist-activating radiation such as ultra-violet light which is projected through the transparent substrate. The activating radiation is chosen to have a wavelength which is absorbed by the silicon islands but not by the substrate or the silox. Thus, the silicon islands are self masking i.e. they block the radiation thereby preventing exposure of the photoresist thereover. Thus, the photoresist should be exposed only in the areas between islands. Subsequently, the photoresist is developed and is utilized as a mask for the etching of the silox layer to expose the top (or upper) surface of the islands without exposing the edges of the islands or the substrate. This prior art technique is subject to sporatic and spotty results as a result of wafer to wafer variations in the quality of the exposure. Underexposure of the photoresist results in the silox being removed from the edges of the islands, thus defeating the purpose of the protective oxide back fill. Overexposure of the photoresist usually results in silox remaining on at least a portion of the upper surface of the islands. Silox extending over the upper surface of the island can adversely effect the quality of devices formed in the island and can prevent the formation of operative devices. Utilizing this technique, the latitude or degree of variation in the itensity and duration of exposure of the wafer to photoresist-activating radiation which results in proper exposure of the photoresist is small. As a result, the quality of the exposure varies from wafer to wafer. In some instances, some portions of a wafer may be underexposed while other portions are overexposed. A further problem with this technique is the fact that the photoresist coating is sometimes scratched by the wafer chuck, with the result that the photoresist does not protect the silox everywhere it should.

As a result of the prior art difficulties with achieving proper exposure of the photoresist, the silox backfill layers are protected by photoresist during etching of silicon oxide only while the silox back-fill is initially being defined. As a consequence, each time silicon oxide over the islands is etched, part of the backfill is etched away. If a sufficient quantity of the backfill is etched away in this manner, some of the problems which the backfill is intended to prevent can occur.

Thus, a technique is needed which will assure proper exposure of the photoresist thereby assuring that the edges of the islands will be protected by the back-fill silox and that the upper surface of the islands will be substantially uniformly and completely free of silox and thus exposed to subsequent processing environments. Further, a technique is needed which will allow the back-fill silox to be protected during each etching of silicon oxide, not just during the etch which defines the back-fill.

SUMMARY OF THE INVENTION

The present invention overcomes the problems of the prior art through use of a black body fixture to support the wafer during exposure of the photoresist, without contacting the portion of the photoresist coating which overlies the utilizable area of the wafer. The black-body fixture preferably has an internal non-reflecting cavity for receiving photoresist activating radiation which passes through the photoresist. A support surface is configured to support the wafer in alignment with an opening to the cavity.

DETAILED DESCRIPTION OF THE PREFERRED EMBODIMENT

Figure 1:
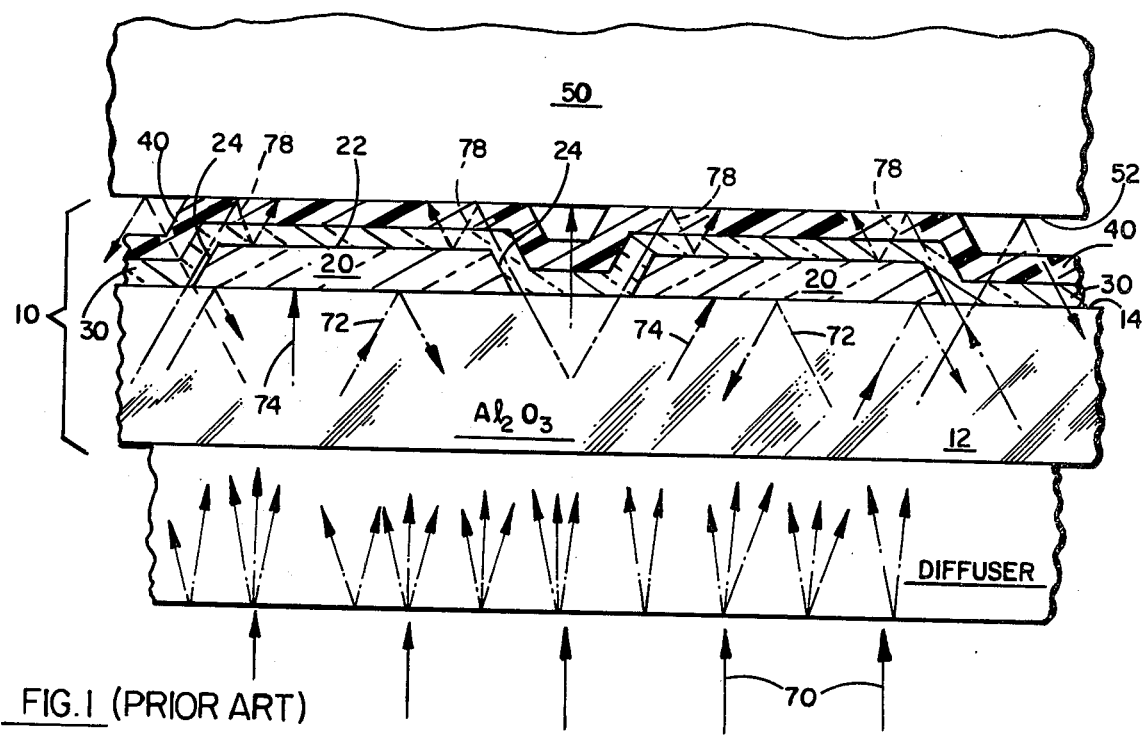
FIG. 1 illustrates a prior art photoresist exposure fixture and the manner in which this prior art exposure fixture causes improper exposure of the photoresist.
Figure 2:
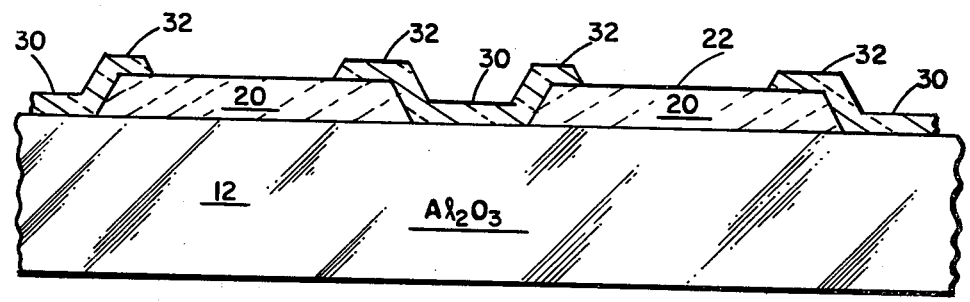
FIGS. 2 and 3 illustrate characteristics of the silox layer which result from overexposure and underexposure, respectively, of the photoresist using the exposure fixture of FIG. 1.

FIG. 1 illustrates a portion of a silicon-on-sapphire wafer 10 which is disposed on a prior art wafer chuck 50 during exposure of a layer 40 of photoresist by photoresist-activating radiation 70 which passes through sapphire substrate 12 before encountering the photoresist 40. FIG. 1 as illustrated in the drawings is inverted from its normal position during exposure of the photoresist. FIG. 1 has been inverted in the drawings in order that the silicon-on-sapphire wafer in FIG. 1 may have the same orientation as the silicon-on-sapphire wafers in FIGS. 2 and 3.

Silicon-on-sapphire wafer 10 comprises a sapphire substrate 12 having a polished surface 14 on which a plurality of silicon islands 20 are disposed. The silicon islands 20 have a substantially planar upper surface 22 and sloped edges 24. A silox layer 30 overlies the upper surface 22 and the edges 24 of the silicon islands 20 and the portion of the polished sapphire surface 14 which is exposed between the silicon islands. A layer 40 of negative photoresist overlies the silox layer 30 and is pre-baked. Then the wafer 10 is disposed with the photoresist layer 40 in contact with a wafer support surface 52 of wafer chuck 50. Wafer support surface 52 is painted black with the intention of preventing photoresist-activating radiation which has once passed through photoresist layer 40 from reflecting from surface 52 back into the photoresist.

Once the photoresist layer 40 has been exposed to activating radiation while supported by wafer chuck 50, the photoresist is developed, thereby removing the unexposed photoresist. The remaining photoresist is post-baked to assure good adhesion to the silox layer. Subsequently, silicon-on-sapphire wafer 10 is immersed in an etching solution which attacks silicon dioxide (the silox) but does not attack the photoresist and the silicon of the islands 20, or attacks them slowly enough that the photoresist protects the silox thereunder throughout the etching step and only an allowable quantity (preferably none) of the silicon is removed by the etching solution. Once all the silox which is not protected by photoresist has been removed by the etching solution, the silicon-on-sapphire wafer is removed from the etching solution and rinsed. The photoresist may then be stripped from the remaining silox.

Figure 3:
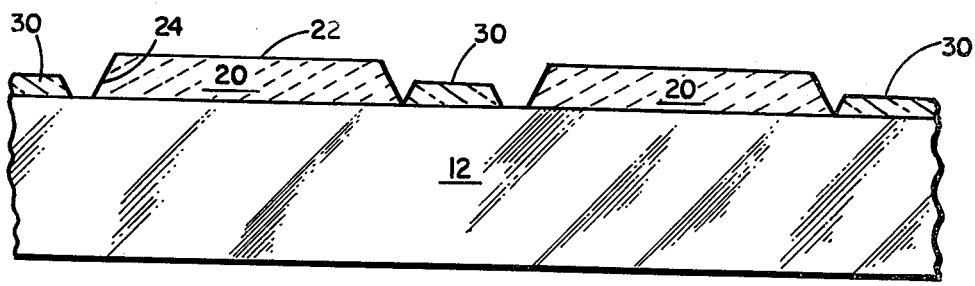

Wafers processed in accordance with the above-described prior art process exhibit variable, sporatic results as to what portion of the silox layer remains after the etching step. Where the photoresist is over exposed, the silox remaining after etching tends to extend part way across the upper surface 22 of the silicon islands 20. The portions of the remaining silox which extend along the upper surface 22 of islands 20 have been denominated 32 in FIG. 2. Silox portions 32 restrict the area of the islands in which devices may be fabricated. Where devices are designed to extend to the edges of the upper surface 22 of the islands, the silox portions 32 produce unintentional, uncontrolled changes in the dimensions and characteristics of the devices. Sufficiently large silox extensions 32 can result in the formation of non-functional devices.

Where the photoresist is underexposed in the above-described process, the etching step removes the silox not only from the upper surfaces 22 of the islands, as is intended, but also removes the silox from varying portions of the island edges and sometimes from a portion the surface 14 of the substrate 12. This condition is illustrated in FIG. 3. When the silox is removed from the island edges, the whole purpose of the oxide backfill, photoresist masking and etching process is defeated and the quality control problems which result from exposure of island edge 24 to processing environments are not reduced.

We have discovered, that where wafer chuck 50 is utilized to support the wafer during activating exposure of the photoresist, the surface 52 of the wafer chuck, despite having been painted black, reflects sufficient activating radiation 78 back into the photoresist that a portion of the photoresist over the upper surfaces 22 of the islands 20 which should not be exposed is in fact exposed. It is this unintended exposure of the photoresist over the upper surface 22 of the islands which causes the etching step to leave silox portions 32 along portions of the upper surfaces of the islands intact.

It is believed that the difficulty in properly controlling the exposure of the photoresist utilizing the wafer chuck 50 results at least in part from the reflection of activating radiation back into the photoresist by wafer chuck surface 52 and that the variation in this reflection is at least in part due to the quality of the contact between the photoresist layer 40 and the surface 52 of the wafer chuck varying from area to area within a single silicon-on-sapphire wafer and from wafer to wafer. These variations apparently result in the range of exposure intensities and times which will consistently result in proper exposure of the photoresist becoming vanishingly small. This conclusion is supported by instances which have been observed, in which the photoresist over some portions of a silicon-on-sapphire substrate was overexposed and the photoresist on other portions of the substrate was underexposed.

Figure 4:
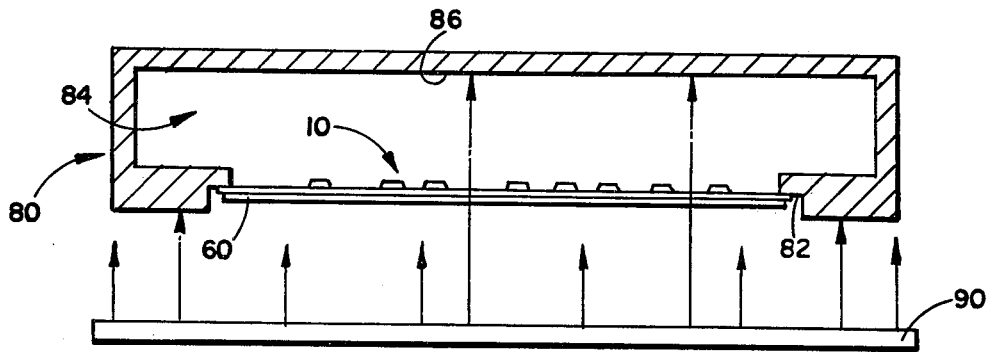
FIG. 4 illustrates a preferred embodiment of a black-body exposure fixture in accordance with the invention.

The problems of the above-described prior art process have been substantially eliminated through use of a black-body wafer chuck or fixture in accordance with the invention. The term "black-body" is used in the physics sense where a black body has zero reflectivity at all wavelengths. However, for purposes of this specification the black-body is defined as having a small enough reflectivity that during photoresist exposure, it will not reflect sufficient photoresist-activating radiation into the photoresist to expose the photoresist. Thus, although the black body preferably has a low reflectivity at all wavelengths, it must have a sufficiently low reflectivity at the wavelength of the photoresist activating radiation. A preferred embodiment of a fixture in accordance with the invention is illustrated generally at 80 in FIG. 4. In FIG. 4, fixture 80 is inverted from its normal operating orientation when an alignment machine is utilized as the source of photoresist activating radiation. The inversion of fixture 80 is to allow the silicon-on-sapphire wafer 10 of FIG. 4 to be illustrated in the same orientation as the silicon-on-sapphire wafers in FIGS. 5 and 6. However, it will be understood that the fixture 80 may be utilized in the position illustrated if a support is provided to prevent the wafer from falling out of the fixture. If such a support is transparent, it may extend beneath the entire wafer and fixture 80. However, if such a support is opaque, it should be restricted to the waste area of the wafer where it will not shadow the utilizable area of the wafer where devices are to be formed.

Wafer support fixture 80 avoids contacting the photoresist over the utilizable area of the wafer where active devices are to be formed. Contact is avoided by providing cavity 84 which subtends the utilizable area of the wafer with which it is aligned. The space between the utilizable area of the wafer and the surface of cavity 84 eliminates the problem of reflections of photoresist-activating radiation which vary with the quality of the contact between the photoresist layer 40 and another surface such as surface 52 of the prior art wafer chuck. Further, the fixture 80 in accordance with the present invention has no surface close enough to the photoresist layer 40 to reflect a photoresist exposing quantity of the photoresist activating radiation into the photoresist layer 40. That is, even if there is some reflection of photoresist-activating radiation from the surface of cavity 84, the reflectivity of that surface is low enough and the surface is far enough from the wafer that the total quantity of any reflected radiation which does enter the photoresist during an exposure operation is insufficient to activate the photoresist. Thus, photoresist-activating radiation which has once passed through photoresist layer 40 is not reflected back into the photoresist in sufficient quantities to expose the photoresist. The use of the preferred embodiment in which the portions of the photoresist coating overlying the utilizable area of the wafer, i.e., the areas where active devices are to be formed, do not touch the support fixture also minimizes the problem of scratches in the photoresist which can allow portions of the silox to be attacked during the silox etch which would be protected by the photoresist if it were not scratched.

Figure 5:
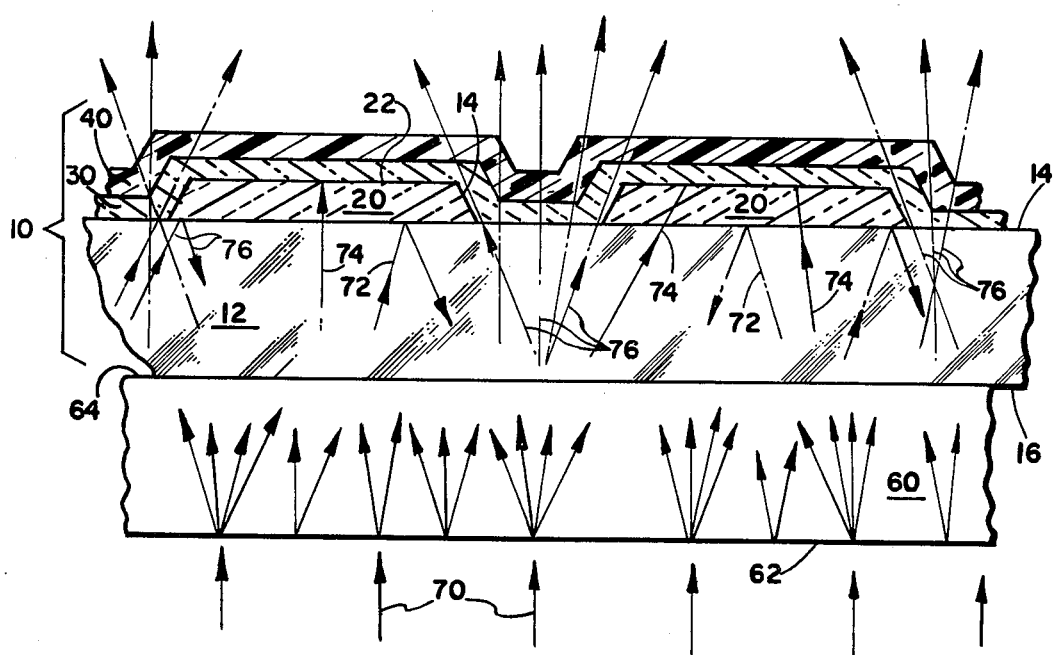
FIG. 5 illustrates the exposure of the photoresist coating on a wafer which is supported by the fixture of FIG. 4.

A portion of a silicon on sapphire wafer 10 is illustrated in FIG. 5 during exposure to photoresist activating radiation using a wafer support fixture in accordance with the present invention. Wafer 10 comprises a transparent substrate 12 such as sapphire which has a polished upper surface 14 on which a plurality of silicon islands 20 are disposed. A silox layer 30 is disposed over the islands 20 and the portions of surface 14 which are not covered by islands 20. A coating or layer 40 of photoresist overlies silox layer 30.

To expose photoresist 40, photoresist-activating radiation 70 is projected through substrate 12 toward photoresist 40. A radiation source 90 is selected which produces photoresist-activating radiation 70 of a wavelength to which the silicon islands are essentially opaque and to which the substrate 12 and silox layer 30 are essentially transparent.

Substrate 12 has a surface 16 opposite to and substantially parallel to polished surface 14. Surface 16 may be polished or may be a rough surface such as that produced by lapping. Where (1) the surface 16 is polished, (2) the photoresist activating radiation 70 is colimated and (3) the island edges 24 are sloped, a diffusor 60 should be provided to assure that the photoresist over the island edges 24 will be exposed by the activating radiation. The diffusor 60 may comprise an additional sapphire substrate having a rough surface 62 which will serve to diffuse incident activating radiation. A surface 64 of the diffusor 60 which is disposed substantially parallel to the surface 62 and preferably in contact with substrate 12 may be either a smooth polished surface or a rough flat surface. Where the surface 16 of substrate 12 is a rough, lapped surface, the additional diffusor 60 may not be necessary. However, its presence assures that the photoresist-activating radiation is sufficiently diffused that the photoresist over the island edges 24 will be exposed.

Colimated photoresist-activating radiation 70 upon encountering the lapped surface 62 of diffusor 60 becomes a diffused illumination, which illumination may be further diffused upon encountering surfaces 64 and 16 if they are rough surfaces. The illumination 70 then passes through substrate 12. The behavior of radiation 70 upon encountering surface 14 of the substrate will depend upon the angle incidence of individual rays of the illumination 70 and the relative indices of refraction of substrate 12 and the overlying material, silicon islands 20 or silox layer 30. Those rays exceeding the critical angle of the interface will be reflected back into substrate 12. Those rays not exceeding the critical angle will pass from the substrate 12 into the overlying structure. Because its wavelength is absorbed by silicon islands 20, that radiation 74 which enters the silicon islands 20 will be absorbed and will not pass into silox layer 30 or photoresist layer 40. The radiation 76 entering the silox layer 30 will pass through the silox 30 and enter the photoresist 40, thereby exposing the photoresist. There is no immediate reflection of the radiation 76 back into photoresist layer 40 and the surface of the cavity is of low enough reflectivity and is far enough away from the wafer that an exposing quantity of radiation can only enter the photoresist from the wafer. Thus, the photoresist is exposed in the pattern of shadowing produced by the material between the radiation source 90 and the photoresist. In the illustrated embodiment only the silicon islands produce shadows, however, if desired, additional shadowing could be produced by introducing a mask between the radiation source 90 and the wafer.

Figure 6:
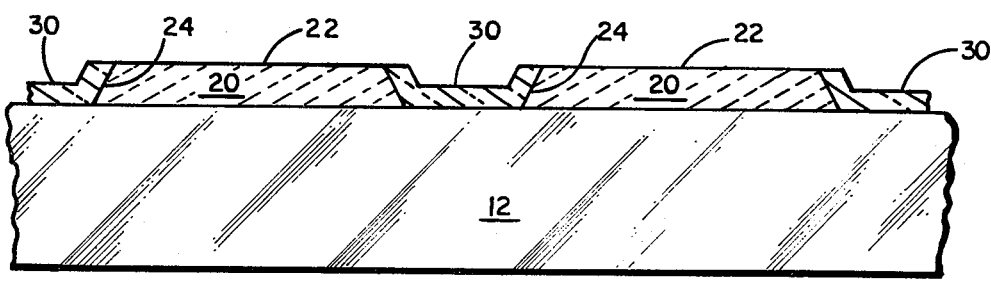
FIG. 6 illustrates the post-etch quality of a silox layer on a wafer which has been properly exposed in the exposure fixture of FIG. 4.

After exposure, the photoresist is developed and post-baked. Subsequently, wafer 10 is immersed in a silox etching solution which removes the silox which is not protected by post-baked photoresist. The resulting silox profile is illustrated in FIG. 6. It will be observed, that substantially the entire edge 24 of the silicon islands 20 is protected by a full thickness layer of silox and that the silox does not extend over the upper surface 22 of the silicon islands 20.

Utilizing a wafer support fixture in accordance with this invention to support silicon-on-sapphire wafers during photoresist exposure yield excellent post-etch silox profiles. The excellent profiles which resulted from an exposure duration of 10 seconds were essentially indistinguishable from those which resulted from an exposure duration of 60 seconds. In contrast, utilizing the same intensity of photoresist-activating radiation it was found that a tightly controlled exposure time of 3.75 seconds was required to obtain good results when the prior art wafer chuck 50 was utilized. Further, even with tight control of the exposure time the prior art chuck 50 produced photoresist exposures the quality of which varied from overexposed to underexposed from wafer to wafer and within some individual wafers.

Because the wafer support fixture of this invention eliminates the problem of uncontrollable overexposure of the photoresist, the oxide backfill can be protected during each oxide etch during the production of devices. Thus, the oxide backfill may be maintained at its original thickness. Protection of the oxide backfill is obtained by using a negative photoresist and exposing the photoresist over the islands from above (or the front) through a mask to define device features and subsequently exposing the photoresist over the backfill from beneath (or through the back of the wafer) prior to developing the photoresist.

As a result of utilization of the photoresist exposure technique of this invention, and the protection of the backfill from subsequent oxide etches, N-channel transistors formulated in silicon-on-sapphire for which leakage currents of 1-10 $\mu$ amp per mil of gate width was considered good when prior art chuck 50 was utilized, are now routinely produced with a leakage current of 0.25 $n$ amp per mil of gate width. Thus, the technique of this invention has generated a substantial improvement in the characteristics of active devices formulated in silicon on sapphire.

For proper exposure of the photoresist, a wafer support fixture which prevents an exposing quantity of the photoresist-activating radiation from entering the photoresist over the island upper surfaces is needed. Thus, a wafer support fixture need not have a back surface 86 so long as an exposing quantity of photoresist-activating radiation cannot impinge on the photoresist layer from the photoresist side of the wafer. It is preferred that wafer support fixture 80 include a cavity 84 which is enclosed when the wafer to be exposed is disposed on the wafer support rim 82 because this assures effective shielding of the photoresist from radiation other than that which enters the photoresist from the wafer.

Use of the silox backfill and the black body exposure method in accordance with the invention for the exposure of the photoresist reduces, minimizes or eliminates the problems such as, junction degradation at the edges of islands as a result of poor passivation, soft breakdown of p-n junctions, discontinuities in metallization coverage, solution leakage into voids along the bases of island edges, island edge etching anomalies which can result in shorted diodes string. Thus, the black body wafer support structure in accordance with the invention, and the method of exposing the photoresist in accordance with the invention enable a substantial advance in the silicon-on-sapphire technology.

It will be understood, that the benefits of the black body exposure technique of this invention are not restricted to silicon-on-sapphire, but are also experienced with other semiconductors, other transparent substrates and other wafers which have features which will selectively block photoresist activating radiation.

A preferred embodiment of a black body wafer support fixture has been illustrated and described. Those skilled in the art will be able to vary the details of the preferred embodiment while still obtaining the invention's advantages over the prior art. However, since a preferred embodiment is illustrative of the invention and not limitive, the protection afforded this invention is limited only by the appended claims.

What is claimed is:

1. A fixture suitable for supporting a photoresist coated wafer during back exposure of said photoresist to photoresist-activating radiation which passes through said wafer prior to entering said photoresist for exposing said photoresist in a pattern determined by the shadowing characteristics of said wafer and any other material through which said radiation passes prior to entering said photoresist, said wafer having first and second sides, said first side including a utilizable area having said photoresist coating thereon, said wafer including at least a portion which is transmissive of photoresist-activating radiation, said fixture comprising:
   housing means having upper and lower surfaces, said upper surface adapted to face a source of said photoresist-activating radiation during the exposure of said photoresist;
   said housing means including support means for supporting said wafer with said first side of said wafer down for back exposure of said photoresist by photoresist-activating radiation which passes through said transmissive portion of said wafer prior to entering said photoresist;
   said support means and said housing means spaced at least a predetermined distance from said photoresist disposed on said utilizable area of said wafer when said wafer is supported by said support means with said first side of said wafer down, said predetermined distance sufficient to assure that any photoresist-activating radiation which passes through said photoresist coated wafer during normal exposure of said photoresist is not reflected back into said photoresist by said support means or said housing means in photoresist-activating quantities, and;
   said housing means including shield means for preventing an exposure-producing quantity of photoresist-activating radiation from entering said photoresist coating except from said wafer.

2. The fixture recited in claim 1 wherein said housing means comprises:
   a black body having a cavity therein for receiving photoresist-activating radiation which passes through said photoresist coated wafer, said cavity having an opening thereto which subtends at least a significant portion of said wafer when said wafer is supported by said support means.

3. The fixture recited in claim 1 wherein said housing means is substantially non-reflective to photoresist-activating radiation.

4. A fixture suitable for supporting a photoresist coated wafer during back exposure of said photoresist to photoresist-activating radiation which passes through said wafer prior to entering said photoresist for exposing said photoresist in a pattern determined by the shadowing characteristics of said wafer and any other material through which said radiation passes prior to entering said photoresist, said wafer having first and second sides, said first side including a utilizable area having said photoresist coating thereon, said wafer including at least a portion which is transmissive of photoresist activating radiation, said fixture comprising:
   a black body having a cavity therein and an upper surface;
   said cavity having an opening thereto and a wall defining said cavity, said opening being in said upper surface, said upper surface adapted to face a source of said photoresist-activating radiation during exposure of said photoresist,
   support means for supporting said wafer with said first side of said wafer down for back exposure of said photoresist by photoresist activating radiation which passes through said transmissive portion of said wafer prior to entering said photoresist;
   said opening subtending at least a significant portion of said wafer when said wafer is supported by said support means with said first side down, and;
   said support means and said wall of said cavity spaced at least a predetermined distance from said photoresist disposed on said utilizable area of said wafer when said wafer is supported by said support means with said first side of said wafer down, said predetermined distance sufficient to assure that any photoresist-activating radiation which passes through said photoresist coated wafer during normal exposure of said photoresist is not reflected back into said photoresist by said support means or said wall of said cavity in photoresist-activating quantities.

5. The fixture recited in claim 4 wherein said support means is disposed in the vicinity of said opening for supporting said wafer in alignment with said opening.

6. The fixture recited in claim 5 wherein said support means is an integral portion of said black body.

7. The fixture recited in claim 6 wherein said support means surrounds said opening and said opening is the only opening to said cavity whereby said cavity becomes substantially an enclosed cavity when a wafer is disposed on said support means.

8. The fixture recited in claim 4 wherein said opening subtends at least said utilizable area of said wafer when said wafer is supported by said support means with said first side down.

9. The fixture recited in claim 4 wherein said black body is opaque to photoresist-activating radiation.

10. The fixture recited in claim 4 wherein said support means supports said wafer near the periphery of said wafer.

11. The fixture recited in claim 4 wherein said support means is substantially non-reflective to photoresist-activating radiation.

12. A fixture suitable for supporting a photoresist coated wafer during back exposure of said photoresist to photoresist-activating radiation which passes through said wafer prior to entering said photoresist for exposing said photoresist in a pattern determined by the shadowing characteristics of said wafer and any other material through which said radiation passes prior to entering said photoresist, said wafer having first and second sides, said first side including a utilizable area having said photoresist coating thereon, said photoresist and wafer including at least a portion which is at least partially transmissive of photoresist-activating radiation, said fixture comprising:
 a black body having a cavity therein and an upper surface;
 said cavity having an opening thereto and a wall defining said cavity, said opening being in said upper surface, said upper surface adapted to face a source of said photoresist-activating radiation during exposure of said photoresist;
 said black body being opaque and substantially non-reflective to said photoresist-activating radiation;
 said black body including support means surrounding said opening for supporting said wafer in alignment with said opening with said first side of said wafer down for back exposure of said photoresist by photoresist-activating radiation which passes through said transmissive portion of said wafer prior to entering said photoresist;
 said opening subtending at least said utilizable area of said wafer when said wafer is supported by said support means with said first side down, and;
 said support means and said wall of said cavity spaced at least a predetermined distance from said photoresist disposed on said utilizable area of said wafer when said wafer is supported by said support means with said first side of said wafer down, said predetermined distance being sufficient to assure that any photoresist-activating radiation which passes through said photoresist coated wafer during normal exposure of said photoresist is not reflected back into said photoresist by said support means or said wall of said cavity in photoresist-activating quantities.

13. A method of exposing a coating of photoresist on a wafer, said wafer having first and second sides, said first side including a utilizable area having said photoresist coating thereon, said wafer including at least a portion which is transmissive of photoresist-activating radiation, said method comprising:
 disposing said wafer on support means with said first side of said wafer away from a source of photoresist-activating radiation for back exposure of said photoresist is photoresist-activating radiation which passes through said transmissive portion of said wafer prior to entering said photoresist for exposing said photoresist in a pattern determined by the shadowing characteristics of said wafer and any other material through which said radiation passes prior to entering said photoresist, said wafer being disposed with that portion of the photoresist coating which is disposed on the utilizable area of said wafer out of contact with and spaced at least a predetermined distance from all solid objects other than said wafer, said predetermined distance sufficient to assure that any photoresist-activating radiation which passes through said photoresist coated wafer during normal exposure of said photoresist is not reflected back into said photoresist by said solid objects in photoresist-activating quantities;
 providing shielding means for preventing an exposure-producing quantity of radiation from entering said photoresist coating except from said wafer; and
 directing photoresist-activating radiation from said source of radiation through said wafer into said photoresist to expose said photoresist in accordance with the shadowing characteristics of the material between said radiation source and said photoresist.

* * * * *